United States Patent [19]
Lee et al.

[11] 4,346,330
[45] Aug. 24, 1982

[54] LASER GENERATED HIGH ELECTRON DENSITY SOURCE

[75] Inventors: Chunghsin Lee, Reading; Peter E. Oettinger, Acton, both of Mass.

[73] Assignee: Thermo Electron Corporation, Waltham, Mass.

[21] Appl. No.: 140,390

[22] Filed: Apr. 14, 1980

[51] Int. Cl.³ .......................................... H01J 45/00
[52] U.S. Cl. .................................. 315/150; 310/306; 313/211; 313/227; 315/111.81; 219/121 L
[58] Field of Search ........................ 315/150, 111.8; 310/306; 328/2; 219/121 EB, 121 ET, 121 L; 200/DIG. 36; 313/211, 213, 179–181, 227, 231, 311, 346 R

[56] References Cited

U.S. PATENT DOCUMENTS

| | | | |
|---|---|---|---|
| 3,294,970 | 12/1966 | Jenckel | 250/423 |
| 3,432,664 | 3/1969 | Robinson | 315/149 X |
| 3,679,897 | 7/1972 | Hansen et al. | 313/161 X |
| 3,719,899 | 3/1973 | Breaux | 313/179 X |
| 3,811,070 | 5/1974 | Voshall | 315/150 |
| 3,899,696 | 8/1975 | Fletcher et al. | 310/306 |
| 3,969,628 | 7/1976 | Roberts et al. | 313/55 X |
| 4,091,256 | 5/1978 | Früchtenicht | 219/121 P X |

OTHER PUBLICATIONS

Isenor, *Effect of Background Gas on Laser-Induced Electron Emission from Metal Surfaces*, J. Appl. Phys., vol. 36, pp. 316–317.
Li et al., *Evidence Against Laser-Induced Spontaneous Electron Emission from Rear Side of Metal Foils*, Appl. Phys. Lett., vol. 13, No. 7, 1968, p. 238.
Pittaway et al., *Laser-Induced Electron Emission from Tungston, Tantalum, etc.*, Brit. J. Appl. Phys. (J. Phys. D), 1968, Ser. 2, vol. 1, pp. 711–719.
Dalman et al., *Laser-Heated Cathode*, Proc. IEEE, vol. 52, Feb. 1964, pp. 200–201.
Arifou et al., *Laser-Induced Current Pulses from a Target in a Gas*, Soviet Phys. JETP, vol. 28, No. 2, pp. 201–202, 1969.
Bogdankevich et al., *Use of Laser Radiation to Create a Strong Electron Source*, Soviet Physics-Technical Physics, vol. 10, No. 10, pp. 1573–1574, (1964).

*Primary Examiner*—Eugene R. LaRoche
*Attorney, Agent, or Firm*—Herbert E. Messenger; James L. Neal

[57] ABSTRACT

Apparatus is disclosed for generating high density pulses of electrons thermionically. The apparatus includes a metallic target maintained within a low pressure cesium vapor atmosphere. A laser rapidly heats the cesiated target surface to a high temperature in a time short compared with the residence time of cesium atoms adsorbed on the target surface. This rapid surface heating in combination with the adsorbed cesium atoms emits copious quantities of electrons forming a high current density pulse.

16 Claims, 6 Drawing Figures

LASER GENERATED HIGH ELECTRON DENSITY SOURCE

The Government has rights in this invention pursuant to Contract No. N00014-79-C-0131 awarded by the Department of the Navy.

BACKGROUND OF THE INVENTION

This invention relates to apparatus for the production of electrons and more particularly to such apparatus employing a laser energized thermionic process to generate high density pulses of electrons.

Pulsed sources of electrons of high current density are of value for many purposes, such as for welding and metal working devices, high resolution electron microscopy, intense short burst x-ray emitters, high current switches, electron beam systems, microwave generators and free electron lasers. It is well known to generate pulses of electrons thermionically, i.e., by heating to a high temperature a suitable metallic cathode with an intense laser beam to drive off electrons. The currents so generated, however, have been limited generally to tens of amperes. Furthermore, these electron emissions were achieved typically with focused incident beams which caused target surface damage through vaporization and ionization and hence were not purely thermionic processes. In other known attempts to create high density pulses of electrons the laser flux densities were kept below the destruction level of the metallic target. However, in such cases, very low peak current densities were achieved.

It is, therefore, an object of this invention to generate thermionically pulses of electrons of reasonable spatial area and high current density, for example, current densities of four to six kiloamperes per square centimeter and currents in the range of two to three kiloamperes with pulse widths varying from nanoseconds to tens of microseconds.

It is a further object of the invention to produce such pulses at kilohertz pulse repetition rates.

Yet another object is to provide apparatus in which the electron emitting surface is not damaged by the incident laser flux. Still other objects of this invention are to provide a fast acting, laser driven switch and a laser heated thermal-to-electrical energy converter using the thermionic process. Other objects and advantages of the invention will be apparent in what follows.

SUMMARY OF THE INVENTION

The apparatus for generating high density pulses of electrons according to the present invention includes a metallic target having a surface coated with adsorbed cesium atoms, and a laser for heating the surface of the target to an electron emitting temperature below the melting point of the metallic target in a time interval short compared with the residence time of the cesium atoms adsorbed on the surface of the target. The metallic target may be pre-coated with cesium atoms or, preferably, exposed to cesium vapor so that the surface is continually replenished to effect a "self healing" condition. Suitable metallic targets may be composed of tungsten and tungsten-rhenium alloys.

In a preferred embodiment, the apparatus includes a low pressure chamber filled with cesium vapor in which a metallic cathode is disposed for contact with cesium vapor. An anode is also disposed within the chamber at a suitable spacing from the cathode. A voltage is applied across the anode and the cathode and a laser is employed to provide a pulsed beam for periodically heating the cathode rapidly. By this means, a high electron current pulse flows between the cathode and the anode. The cesium vapor pressure range within the chamber is preferably between $10^{-6}$ and $10^{-3}$ torr.

The invention may also be embodied in a high current, high voltage, fast response switch. In this configuration, a pulse of electrons is generated from the impingement on the front or back side of a target of a pulsed laser beam. The resulting pulse of electrons establishes a conduction path which serves to close the switch.

BRIEF DESCRIPTION OF THE DRAWING

The invention disclosed herein will be understood better by reference to the following drawing of preferred embodiments in which.

DESCRIPTION OF THE PREFERRED EMBODIMENTS

The basis for the electron generation technique disclosed herein is pulsed high intensity irradiation of a cesiated metallic target, i.e., a target having a coating of cesium atoms adsorbed onto its surface. A laser beam rapidly heats the surface of the metallic target in a time interval which is short compared to the residence time of the adsorbed cesium atoms on the surface.

When a metallic element is exposed to cesium vapor, an equilibrium is established in which cesium atoms are continually being adsorbed onto the surface of the metallic element and migrating away from the element. These adsorbed electropositive atoms interact electronically with the metal surface to form dipoles which facilitate the emission of electrons, i.e., reduce the work function of the metal surface. The residence time of a cesium atom is the average length of time that it remains on the surface of the metallic element. If the surface of the element is heated rapidly enough, i.e., in a time interval short compared with the residence time of the cesium atoms, the heating will be accomplished while the cesium atoms remain bound to the surface. This transient combination of high surface temperature and lowered work function of the metallic element allows the emission of an abundance of electrons which form a high current density source.

Figure 1:
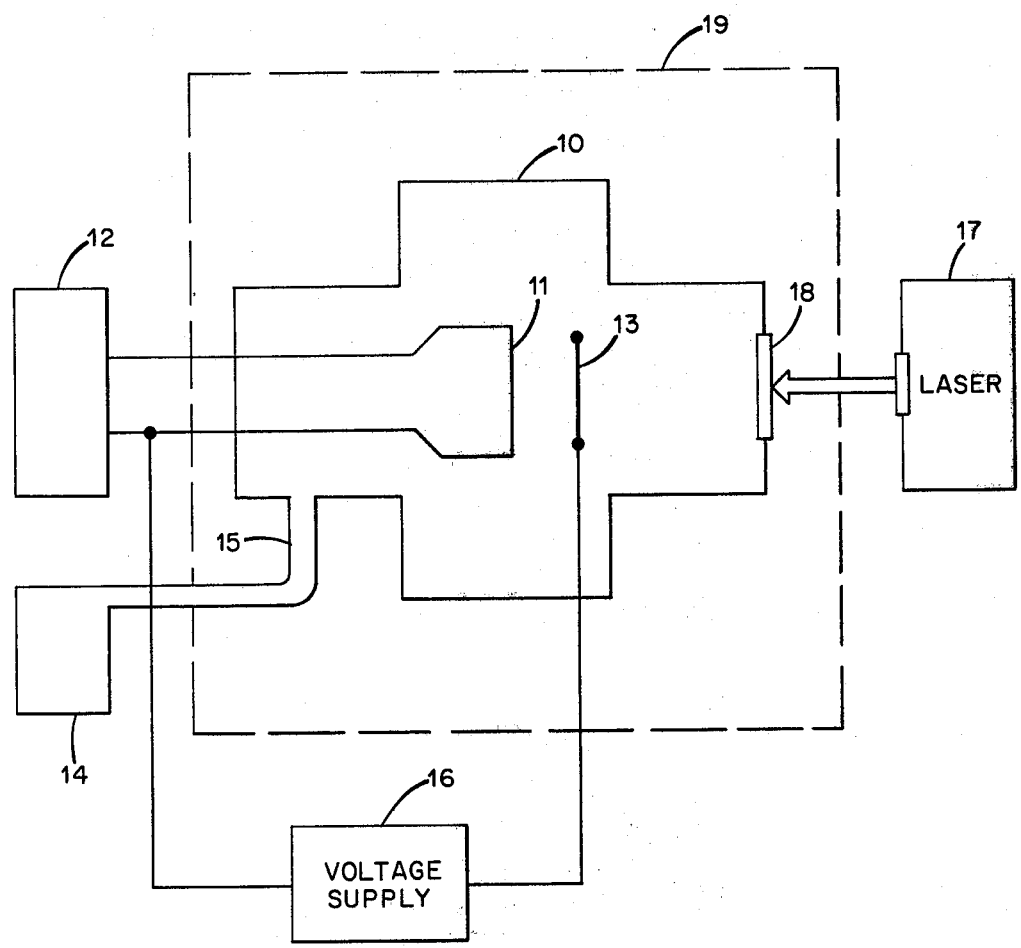
FIG. 1 is a schematic diagram of apparatus for producing high density pulses of electrons.

A preferred embodiment of the apparatus for generating high density pulses of electrons is shown in FIG. 1. A ceramic vacuum chamber 10 houses a tungsten-rhenium foil target emitter 11 which may have a thickness of about 25 micrometers. The emitter 11 can be separately resistance-heated by a power supply 12 to a preselected temperature.

Disposed within the chamber 10 is a ring collector anode 13 which is spaced approximately one centimeter in front of the emitter 11. A cesium vapor reservoir 14 is connected to the chamber 10 by a conduit 15. The cesium reservoir 14 is independently thermally controlled for adjusting the cesium pressure in the chamber 10. A suitable temperature for the cesium reservoir 14 is 350° K. A voltage source 16 applies a voltage between the emitter 11 and the ring collector anode 13.

A laser 17 is provided for illuminating the emitter 11 through a sapphire window 18 in the vacuum chamber 10. The chamber 10 itself is situated inside an oven 19 which maintains a virtually uniform internal temperature.

The operation of the apparatus disclosed herein and as schematically represented in FIG. 1 will become clearer with reference to a specific example of operating conditions. The ceramic vacuum chamber 10 is initially pumped down by conventional means not shown to a pressure of approximately $10^{-8}$ torr. Cesium is then introduced from the cesium reservoir 14 into the chamber 10 to a pressure of about $10^{-4}$ torr. The oven 19 surrounding the chamber 10 is maintained at a temperature of 400° K. The voltage source 16 applies a voltage across the emitter 11 and the ring collector anode 13. It is preferred that this voltage be maximized consistent with restricting the intrachamber leakage current to a few micro-amperes. This maximum voltage is approximately inversely proportional to the cesium vapor pressure. For a vapor pressure of cesium of $10^{-4}$ torr as in this example, the maximum voltage is approximately 770 volts. The laser 17 is a Q-switched neodymium-glass oscillator with two amplifying stages. This laser can emit single mode pulses with a potential power level of 500 megawatts and pulse durations of approximately 20 nanoseconds. In this example, a 50 megawatt laser pulse has been used. The laser 17 generates an unfocused circular beam of approximately 9 millimeters diameter. This unfocused beam is directed through the sapphire window 18 in the chamber 10 onto the emitter 11. In this example the cesium reservoir 14 is maintained at a temperature of approximately 350° K. The 50 megawatt pulse from the laser 17 heats the emitter 11 to approximately 2,000° K. within the 20 nanosecond pulse duration. With the emitter 11 thus heated to 2,000° K., the residence time of adsorbed cesium atoms on the emitter 11 is approximately 100 nanoseconds, a time much longer than the 20 to 30 nanoseconds needed for heating the emitter 11. Thus, cesium atoms remain adsorbed on the emitter 11 surface during the heating process so that the work function is lowered, as has been explained above. The work function under these conditions is approximately two electron volts. Residence time versus temperature and binding energy will be discussed below in conjunction with FIG. 3. A peak current of 2500 amperes has been measured in this example in which the emitter 11 was heated to approximately 2,000° K. within 20 nanoseconds. Because the beam of emitted electrons is approximately 9 millimeters in diameter (the diameter of the illuminating laser beam), the 2500 amperes translates into a current density of 3930 amperes per square centimeter.

Figure 2:
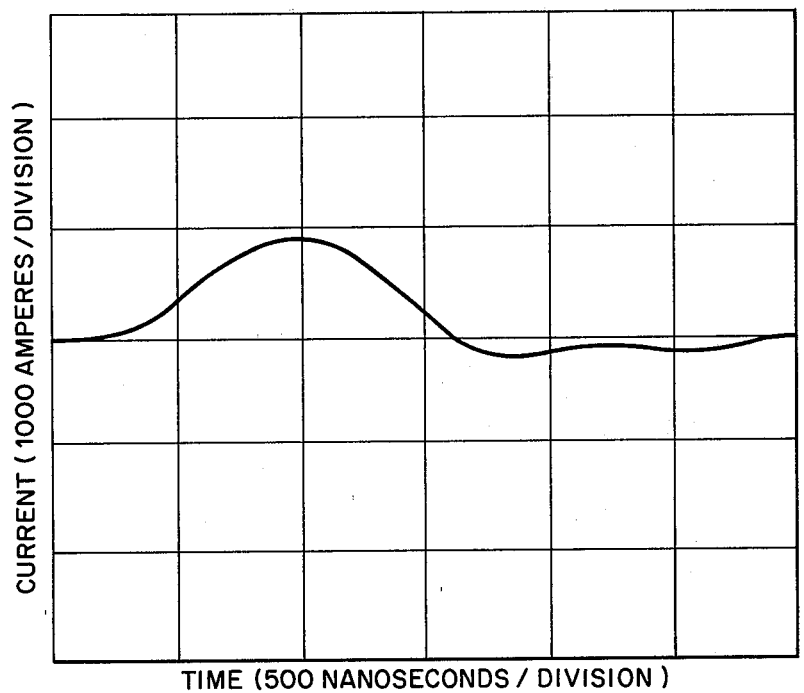
FIG. 2 is a graphical representation of a typical current pulse.

Lowering the cesium pressure in the chamber 10 to approximately $5 \times 10^{-5}$ torr raises the maximum voltage which can be sustained across the emitter 11 and the collector 13 to about 1000 volts. The peak current attained at this pressure is about 1000 amperes which results in a current density of 1560 amperes per square centimeter for a 9 millimeter beam. An oscillogram of such a pulse is shown in FIG. 2. Note that the duration of the current pulse is on the order of one microsecond, which is many times longer than the 20 nanosecond laser pulse which heats the emitter 11 of FIG. 1. The current pulse is much longer than the laser pulse because of the diffusion of the electrons and cesium ions from the target to the collector and reflects the ion transit time between these electrodes.

Although the neodymium glass laser 17 of FIG. 1 is restricted to pulse repetition rates of only several pulses per minute, higher repetition rate lasers are suitable for use in this invention. Generally, the maximum rate at which current pulses can be generated with the apparatus of FIG. 1 is limited by the adsorption characteristics of the cesium on the target. Specifically, the time required between pulses for sufficient cooling of the surface dictates the maximum pulse repetition rate, i.e., the emitter 11 cannot be allowed to get so hot by repeated laser pulses that the residence time of the cesium atoms adsorbed on the emitter is less than the duration of the laser pulse. This pulse rate limitation can be circumvented by heating different areas of the target with successive laser pulses. Very high repetition rates can thus be achieved either by rotating rapidly a disk or drum target or by directing the laser beam onto different target areas. It is anticipated that kilohertz repetition rates can be attained using this technique.

Figure 3:
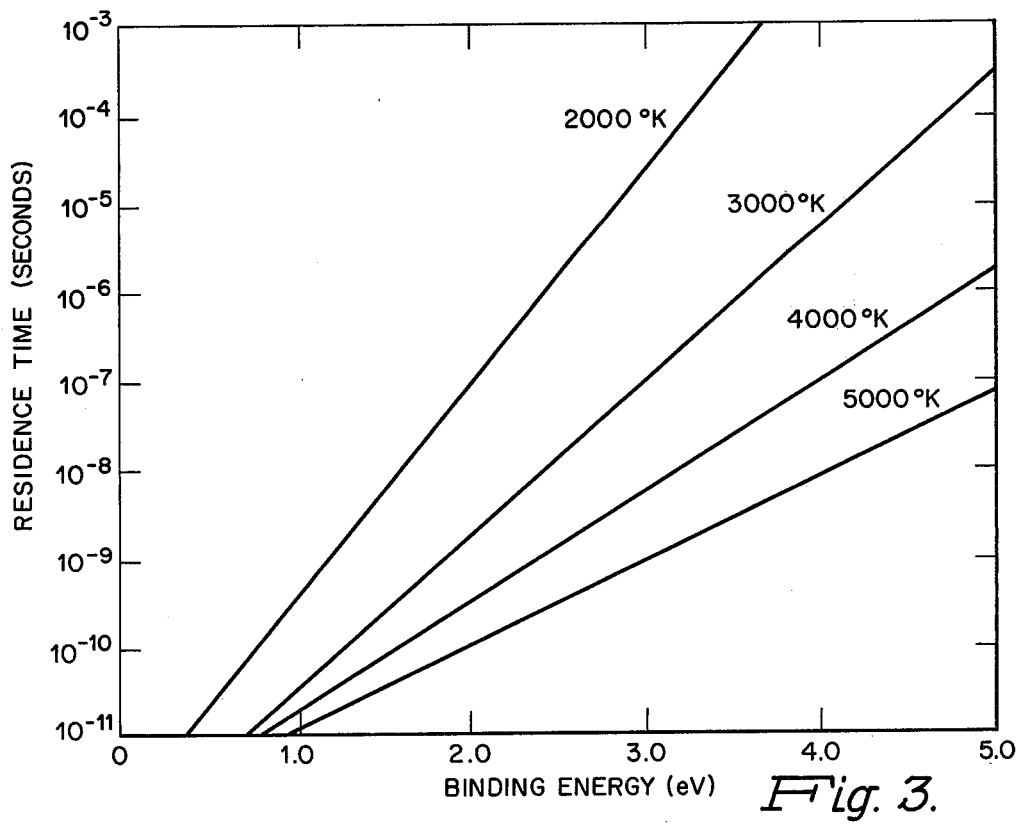
FIG. 3 is a graphical representation of cesium residence time as a function of atomic binding energy and temperature.

Suitable repetition rates can be determined with the aid of the graph shown in FIG. 3. FIG. 3 illustrates the residence time of cesium atoms on a target surface as a function of the binding energy of the adsorbed atoms and the target temperature. For a work function of cesiated tungsten of approximately two electron volts, as discussed in the example above, the binding energy of cesium on the tungsten is expected to be approximately two electron volts. With laser heating of the emitter to 2000° K., FIG. 3 indicates a cesium adsorption residence time of approximately 100 nanoseconds. If, however, the repetition rate were such that the target became heated to 3500° K. the residence time of cesium on the target for the same binding energy of two electron volts would be approximately one nanosecond, which is shorter than the 20 nanosecond laser pulse width used in the example above. Thus, if the laser heated the target to a temperature of 3500° K., the cesium atoms would desorb from the surface within the duration of the laser pulse, thereby greatly diminishing the current pulse achieved.

Figure 4:
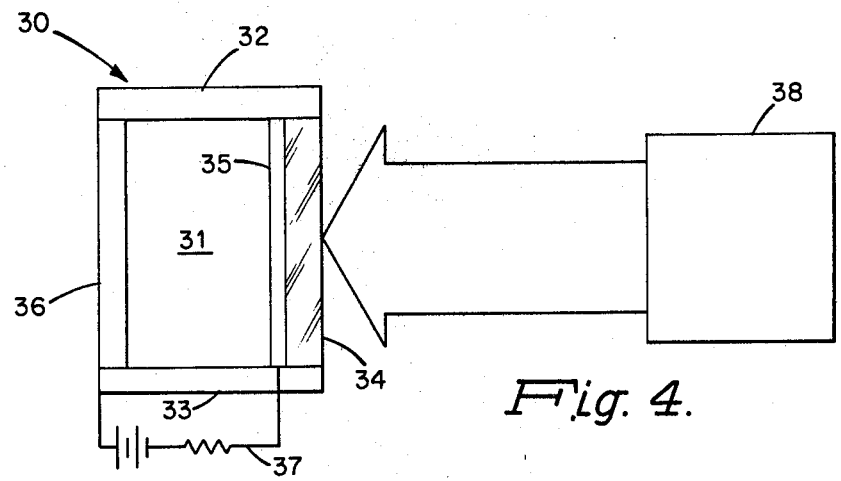
FIGS. 4, 5, and 6 are schematic diagrams of three configurations of a fast acting switch according to this invention.

Electron emission is not limited to the front or illuminated side of a target exposed to laser light. Thermionic electron emission occurs on the back side of thin metallic foil targets as well. Such back side currents, however, are typically five to ten times lower than the currents from the front side of the target. Nevertheless, electron emission from the back side of a target is useful in designing high current-high voltage, fast response switches. One such configuration is shown in FIG. 4. The switch generally designated at 30 includes a chamber containing cesium vapor 31 at a pressure of $10^{-6}$ to $10^{-3}$ torr. The chamber is made up of electrically insulating ceramic side plates 32 and 33. The front of the switch includes a transparent cover plate 34, made for example, of sapphire, and behind that a thin metallic foil target 35 made, for example, of a tungsten-rhenium alloy. The metallic foil 35 should be in the range of 25 micrometers to 75 micrometers thick. The rear of the chamber is formed by a metallic anode 36. When it is desired to operate the switch thereby to complete the circuit 37, a pulse of laser light from a laser 38 is directed onto the metallic foil 35 through the transparent window 34. The pulse of laser light causes the emission of a high density pulse of electrons from the rear side of the foil target 35 toward the anode 36 thereby completing the circuit 37 which includes means such as a power supply for applying a voltage across the anode and cathode. A switch as described in FIG. 4 has applications in pulse power generators and may be used as a thyristor for switching large currents at high voltages. Furthermore, by placing the anode electrode 36 close to the foil target 35, the arrangement of FIG. 4 may be used as an effective thermionic energy converter. That is, the arrangement of FIG. 4 may be used to convert the energy in an incident laser beam into electrical currents. For example, with a spacing between the foil target 35 and the anode 36 of approximately 10 micrometers, laser heating of the target to 2500° K. would generate thermionically 5.2 watts per square centimeter of electrical power assuming that the target 35 and the anode 36 have work functions of about two electron volts. Although the efficiency of such conversion is low, there may be applications where such power conversion is practical, as, for example, power transmission in space in which the target is located very far from the laser.

Figure 5:
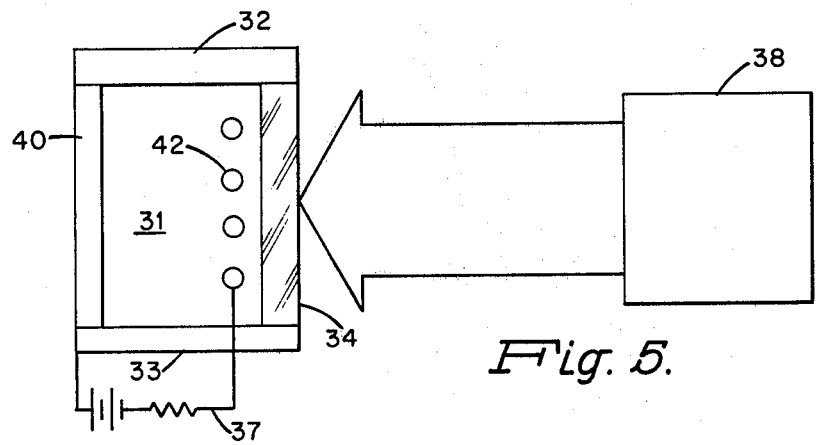
Figure 6:
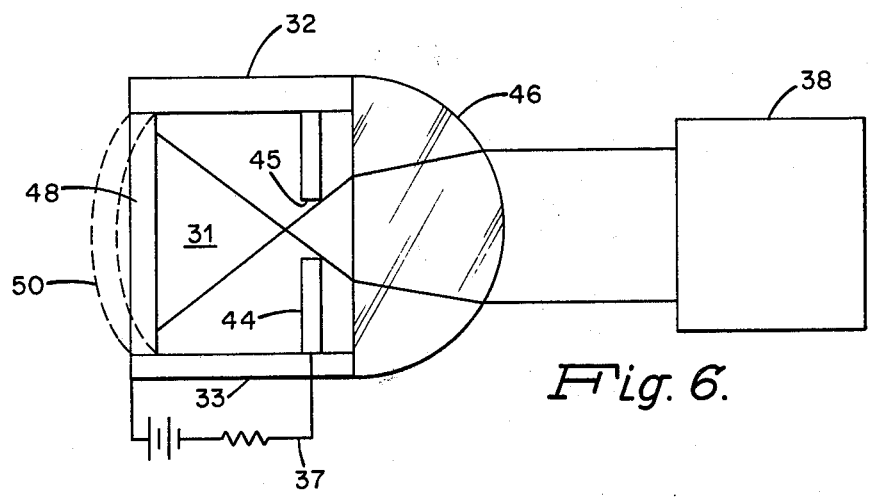

Two other configurations of high current-high voltage, fast response swithes are shown in FIGS. 5 and 6. In these configurations electron emission occurs from the front or illuminated side of their targets 40 and 48, respectively. In order to allow the laser beam to be passed to the target 40, the anode 42 in FIG. 5 is a metallic wire grid or mesh, whereas in FIG. 6 the anode 44 is a metal washer-shaped plate defining a hole 45. The switch in FIG. 6 includes a lens 46 for focusing the incident laser beam so that it passes through the hole 45 to the target 48. Focusing of the laser beam also increases its intensity, which may enhance electron transport from the target 48 to the anode 44 by photoionizing more interelectrode cesium atoms 31 to provide space charge neutralizing positive ions. The path of any reflected light from the incident focused beam bouncing off the target 48 may be controlled by using a concave target 50 as shown by the dashed lines in FIG. 6.

It is thus seen that novel apparatus for producing pulsed high density electron beams by laser irradiation of cesiated targets has been disclosed. This apparatus yields vary high current densities and currents over an order of magnitude greater than heretofore achieved in laser-target interactions. The emissions described herein are thermionic with no apparent damage to the target surface through vaporization.

While the invention disclosed herein has been described with reference to preferred embodiments, it is understood that modifications and variations will occur to those skilled in the art. It is intended that any such modifications and variations be included within the scope of the appended claims.

What is claimed is:

1. Apparatus for thermionically generating high current pulses of electrons comprising:
    a metallic target having a surface coated with adsorbed cesium atoms; and
    laser means for directing a pulse of laser energy onto said target to heat a portion of the surface of said target, said pulse having a duration short compared with the residence time of said cesium atoms on said portion of the surface and having a power level sufficient to heat said portion of the surface to an electron emitting temperature below the melting point of said metallic target to cause thermionic emission of a high current pulse of electrons.

2. The apparatus of claim 1 wherein said metallic target is tungsten.

3. The apparatus of claim 1 wherein said metallic target is a tungsten-rhenium alloy.

4. Apparatus for thermionically generating high current electrical pulses comprising:
    a low pressure chamber containing cesium vapor;
    a metallic cathode disposed within said chamber for contact with, and adsorbtion of, said cesium vapor;
    an anode disposed within said chamber and spaced from said cathode;
    means for applying a voltage across said anode and said cathode; and
    laser means for generating and directing a pulse of laser energy onto a portion of a surface of said cathode, said pulse having a duration short compared with the residence time of said cesium vapor adsorbed onto said portion of the surface of said cathode and having a power level sufficient to heat said portion to an electron emission temperature below the melting point of said cathode.

5. The apparatus of claim 4 wherein said cathode is tungsten.

6. The apparatus of claim 4 wherein said cathode is a tungsten-rhenium alloy.

7. The apparatus of claim 4 wherein said chamber is maintained at a pressure in the range $10^{-6}$ to $10^{-3}$ torr.

8. Apparatus as in claim 4 further comprising:
    a cesium vapor reservoir communicating with said chamber, said reservoir being independently temperature controllable for adjusting the pressure of said cesium vapor within said chamber; and
    a power supply adapted for resistance heating said cathode to a preselected temperature.

9. Method of thermionically generating a high current pulse of electrons comprising the steps of:
    (1) providing a low pressure chamber containing cesium vapor;
    (2) disposing a metallic target within said chamber for contact with, and adsorption of, said cesium vapor; and
    (3) rapidly heating a portion of a surface of said target with a pulse of laser energy in a time interval short compared with the residence time of said cesium vapor adsorbed onto said surface of said target to an electron emission temperature below the melting point of said target to thermionically generate said high current pulses of electrons.

10. The method of claim 9 wherein said target is tungsten.

11. The method of claim 9 wherein said target is a tungsten-rhenium alloy.

12. A high current, high voltage, fast response switch comprising:
    a chamber containing low pressure cesium vapor;
    a thin metallic cathode within said chamber, said cathode having a first and a second side, said second side disposed for contact with, and adsorption of, said vapor;
    an anode disposed within said chamber and spaced apart from said second side of said cathode; and
    laser means for generating and directing a pulse of laser energy to impinge on said first side of said thin metallic cathode, said pulse having a duration short compared with the residence time of said cesium vapor adsorbed on said second side of said cathode and having a power level sufficient to heat at least a portion of said second side of said cathode to an electron emission temperature below the melting point of said cathode to cause thermionic emission of a high current pulse of electrons.

13. A high current, high voltage, fast response switch comprising:

a chamber containing low pressure cesium vapor;

a metallic cathode disposed within said chamber, said cathode having one side in contact with said vapor;

an anode disposed within said chamber and comprising a metallic wire grid spaced apart from said side of said cathode; and laser means for generating and directing a pulse of laser energy through said wire grid to impinge on a portion of said side of said cathode, said pulse having a duration short compared with the residence time of said cesium vapor adsorbed on said portion of said side of said cathode and having a power level sufficient to heat said portion of said side of said cathode to an electron emission temperature below the melting point of said cathode to cause thermionic emission of a high current pulse of electrons.

14. A high current, high voltage, fast response switch comprising:

a chamber containing low pressure cesium vapor;

a metallic cathode disposed within said chamber, said cathode having one side in contact with said vapor;

an anode disposed within said chamber and spaced apart from said side of the cathode, said anode comprising a metallic plate having a hole therein;

laser means for generating and directing a pulse of laser energy toward said anode; and a focusing lens between said anode and said laser means for directing said pulse of energy through the hole in said anode and in a path to impinge on a portion of said side of said cathode;

said pulse having a duration short compared with the residence time of said cesium vapor adsorbed on said portion of said side of said cathode and having a power level sufficient to heat said portion of said said cathode to an electron emission temperature below the melting point of said cathode to cause thermionic emission of a high current pulse of electrons.

15. Apparatus for thermionic energy conversion comprising:

(1) a chamber containing low pressure cesium vapor;

(2) a thin metallic target within said chamber, said target having a first side and a second side, said second side disposed for contact with, and adsorbtion of, said vapor;

(3) an electrode disposed within said chamber and closely spaced from said second side of said target; and (4) laser means for generating and directing a pulse of laser energy to impinge on said first side of said target, said pulse having a duration short compared with the residence time of said cesium vapor adsorbed on said second side of said target and having a power level sufficient to heat at least a portion of said second side of said target to an electron emission temperature below the melting point of said target, thereby producing an electrical current and voltage between said target and said electrode to generate electrical power.

16. The apparatus of claim 15 wherein the separation between said target and said electrode is about 10 micrometers.

* * * * *